(12) United States Patent
Huang et al.

(10) Patent No.: US 10,177,220 B2
(45) Date of Patent: Jan. 8, 2019

(54) HIGH VOLTAGE METAL OXIDE SEMICONDUCTOR DEVICE

(71) Applicant: RICHTEK TECHNOLOGY CORPORATION, Zhubei, HsinChu (TW)

(72) Inventors: Tsung-Yi Huang, HsinChu (TW); Chu-Feng Chen, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 15/662,277

(22) Filed: Jul. 27, 2017

(65) Prior Publication Data

US 2018/0350903 A1 Dec. 6, 2018

(30) Foreign Application Priority Data

Jun. 1, 2017 (TW) .............................. 106118055 A

(51) Int. Cl.
| | |
|---|---|
| *H01L 29/06* | (2006.01) |
| *H01L 29/78* | (2006.01) |
| *H01L 29/10* | (2006.01) |
| *H01L 29/40* | (2006.01) |
| *H01L 21/265* | (2006.01) |
| *H01L 21/266* | (2006.01) |
| *H01L 21/324* | (2006.01) |
| *H01L 21/225* | (2006.01) |
| *H01L 29/66* | (2006.01) |

(52) U.S. Cl.
CPC ...... *H01L 29/0634* (2013.01); *H01L 21/2253* (2013.01); *H01L 21/266* (2013.01); *H01L 21/26513* (2013.01); *H01L 21/324* (2013.01); *H01L 29/1083* (2013.01); *H01L 29/1095* (2013.01); *H01L 29/408* (2013.01); *H01L 29/66681* (2013.01); *H01L 29/7816* (2013.01)

(58) Field of Classification Search
CPC ................... H01L 29/66674–29/66734; H01L 29/7801–29/7826; H01L 29/04–29/045; H01L 29/16–29/1608; H01L 29/18–29/185; H01L 29/22–29/2206; H01L 29/36–29/365; H01L 29/0856–29/0869; H01L 29/0873–29/0886; H01L 29/0634
See application file for complete search history.

(56) References Cited

U.S. PATENT DOCUMENTS

2014/0264581 A1* 9/2014 Chan ................. H01L 29/42368
257/339
2016/0284841 A1* 9/2016 Min .................... H01L 29/1033

* cited by examiner

*Primary Examiner* — Tucker J Wright
(74) *Attorney, Agent, or Firm* — Tung & Associates

(57) ABSTRACT

A high voltage MOS device includes: a first drift region with a first conductive type, a body region with a second conductive type, plural second drift regions with the second conductive type, a gate, a source region with the first conductive type, a drain with the first conductive type, and a body contact region with the second conductive type. The plural second drift regions contact the body region along the lateral direction, and are located separately in the width direction. Any neighboring two second drift regions do not contact each other. Each of the second drift regions is separated from the drain by the first drift region.

8 Claims, 13 Drawing Sheets

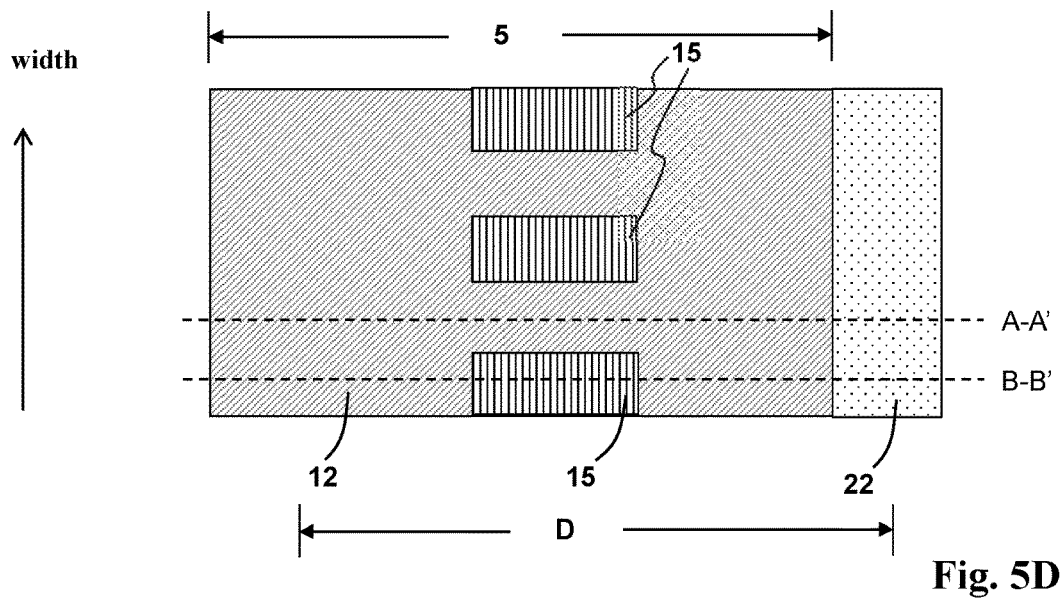
Fig. 5D
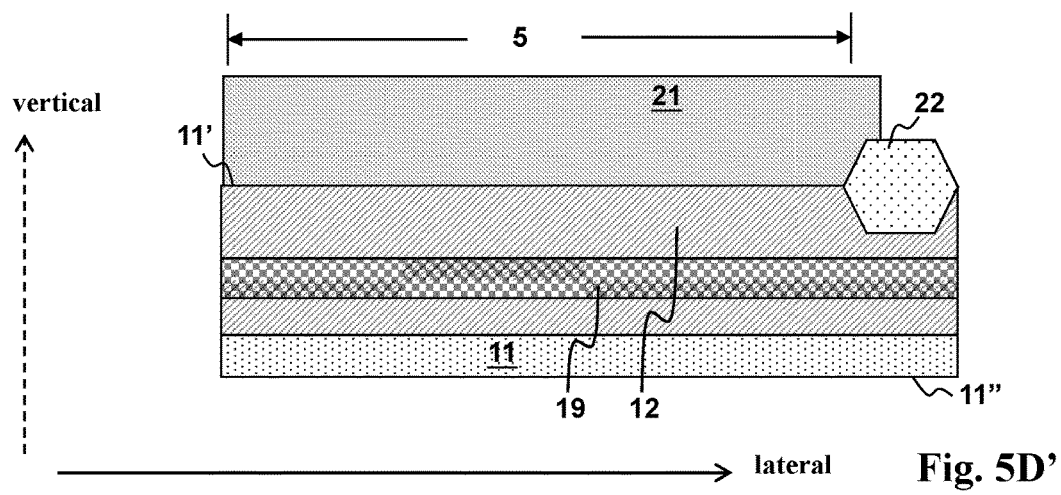
Fig. 5D'
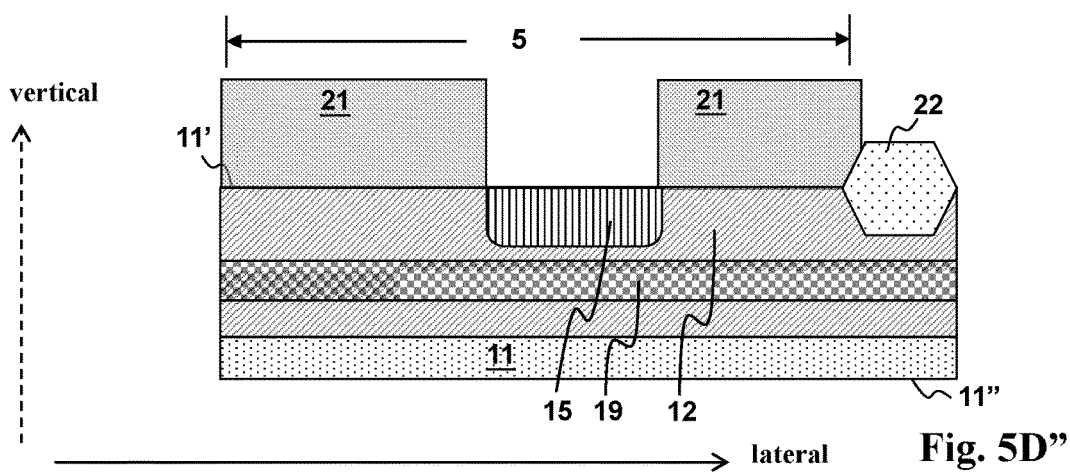
Fig. 5D"

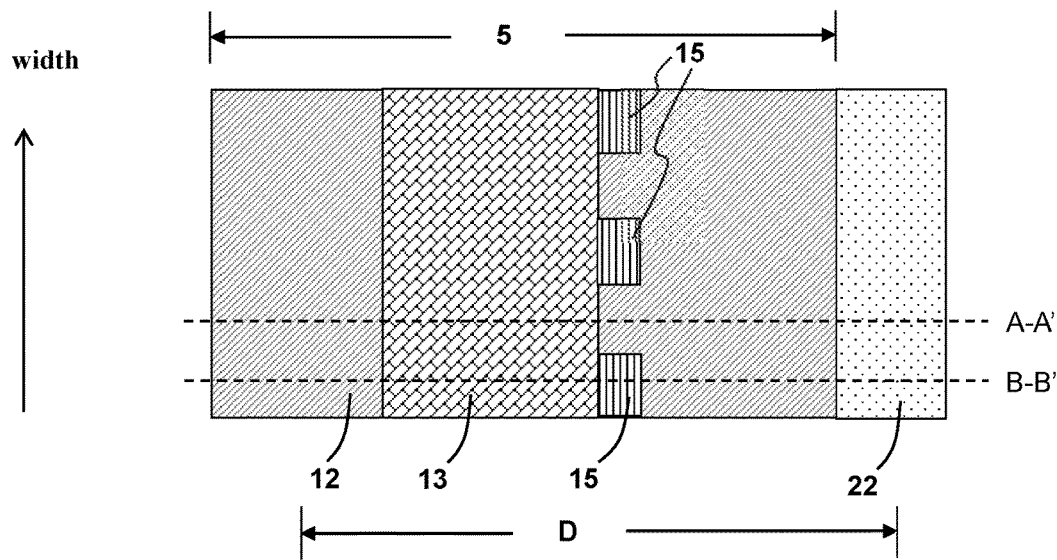
Fig. 5E
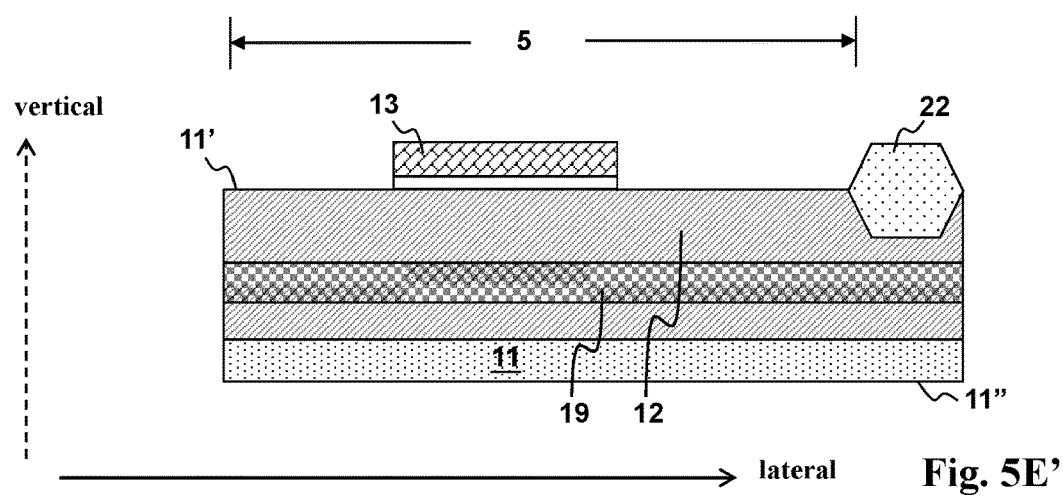
Fig. 5E'
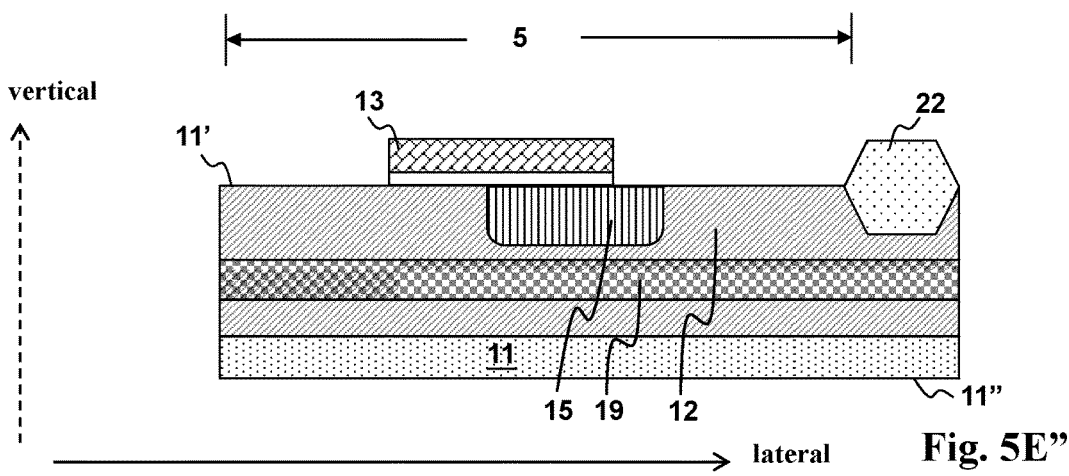
Fig. 5E"

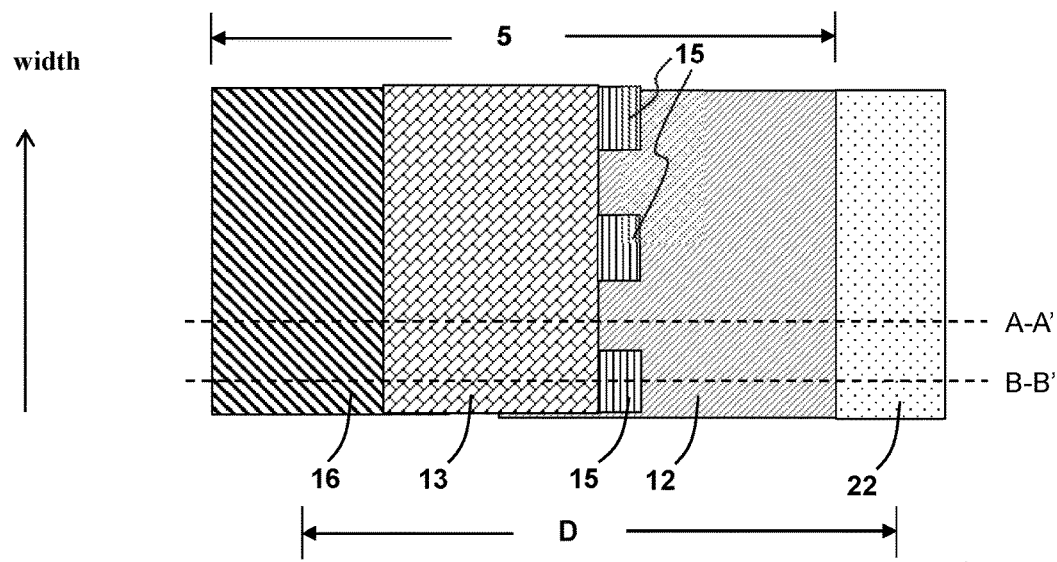
Fig. 5F
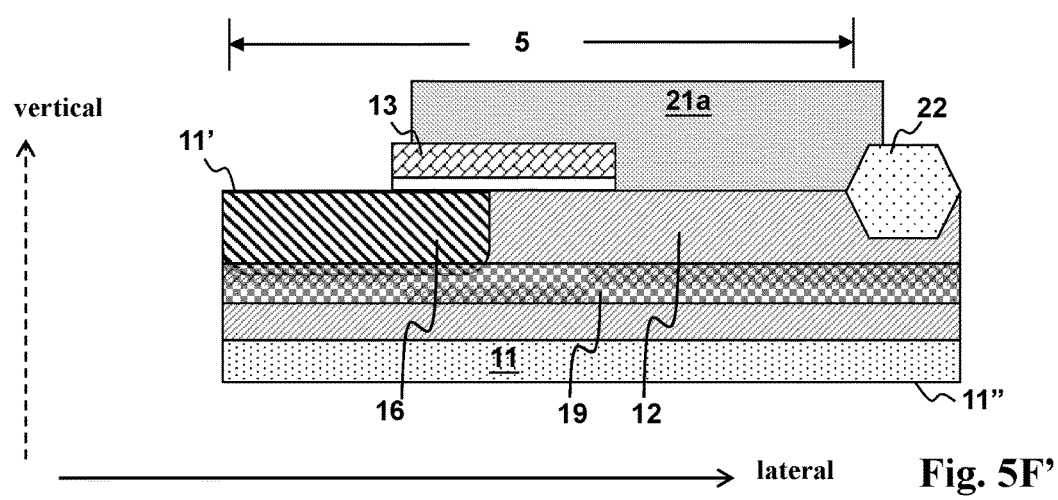
Fig. 5F'
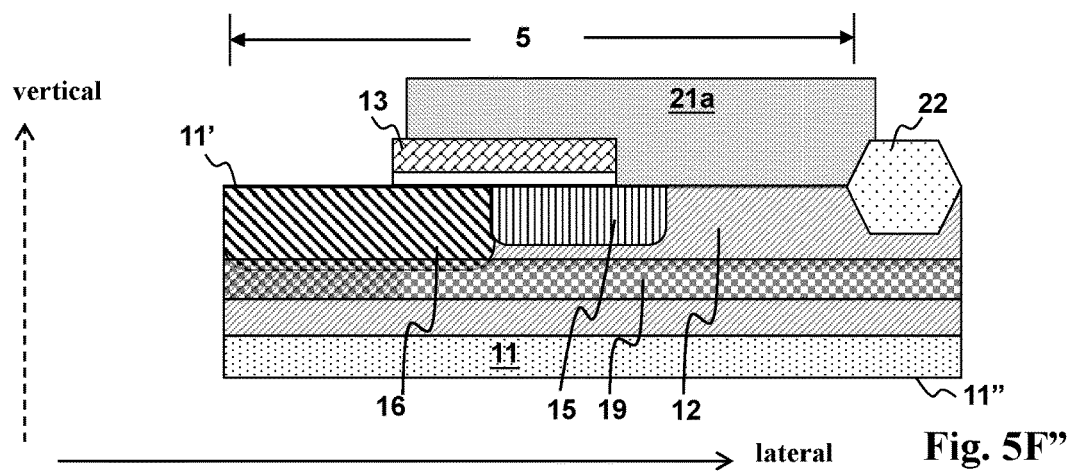
Fig. 5F"

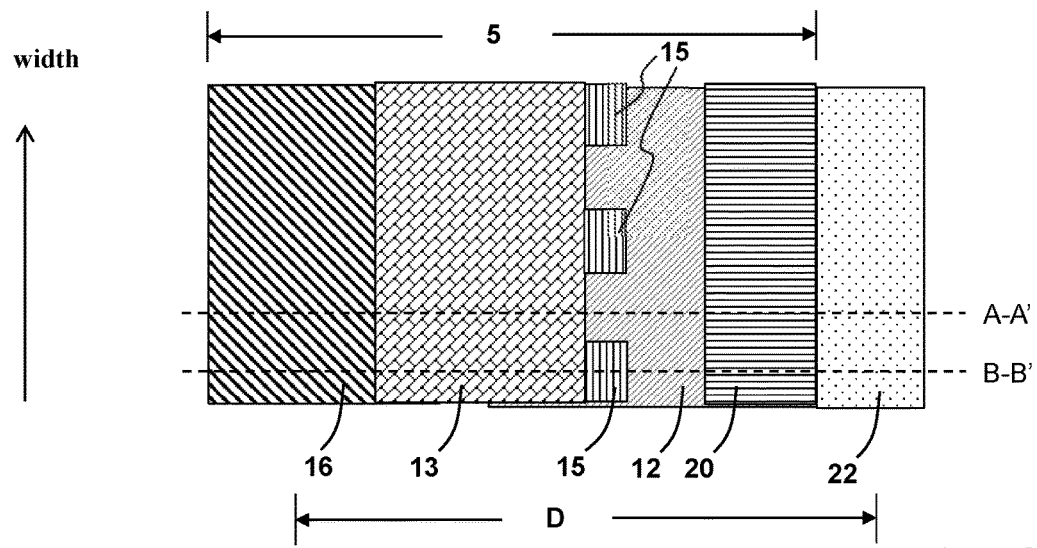
Fig. 5G
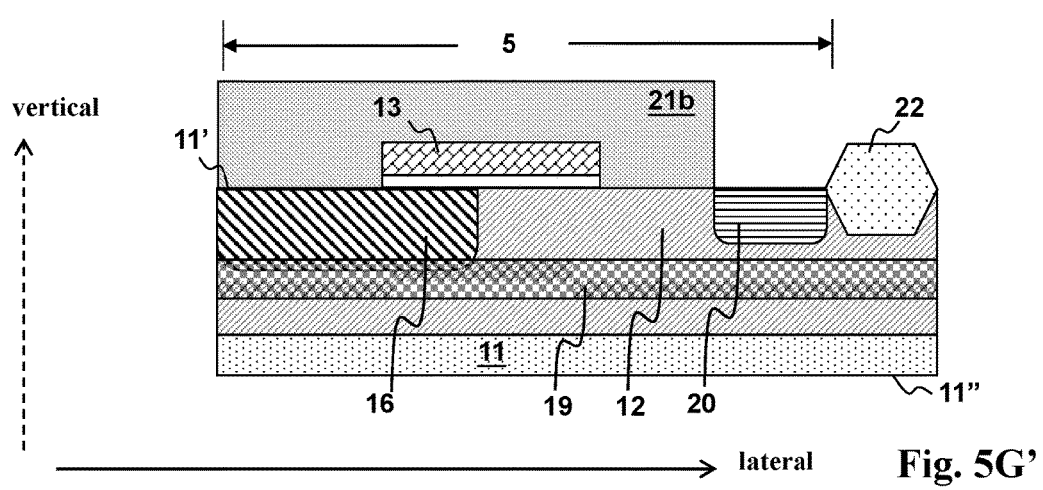
Fig. 5G'
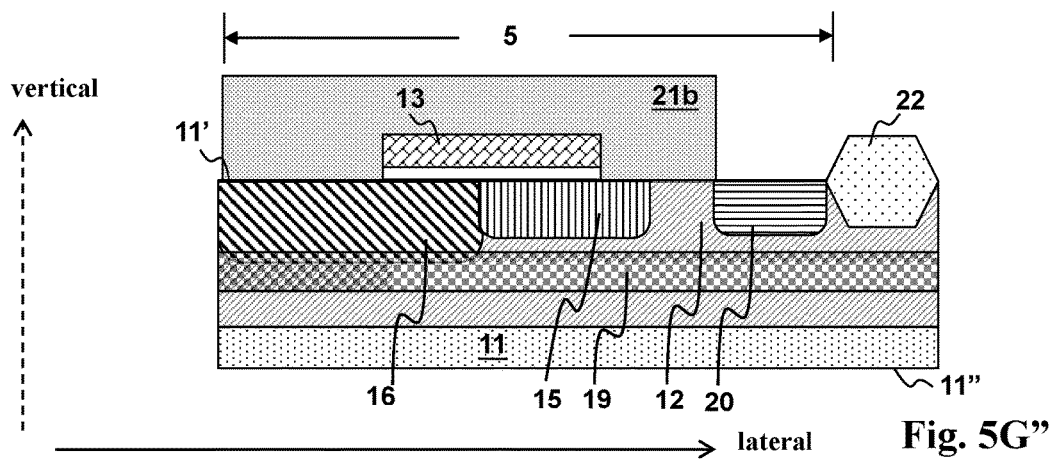
Fig. 5G"

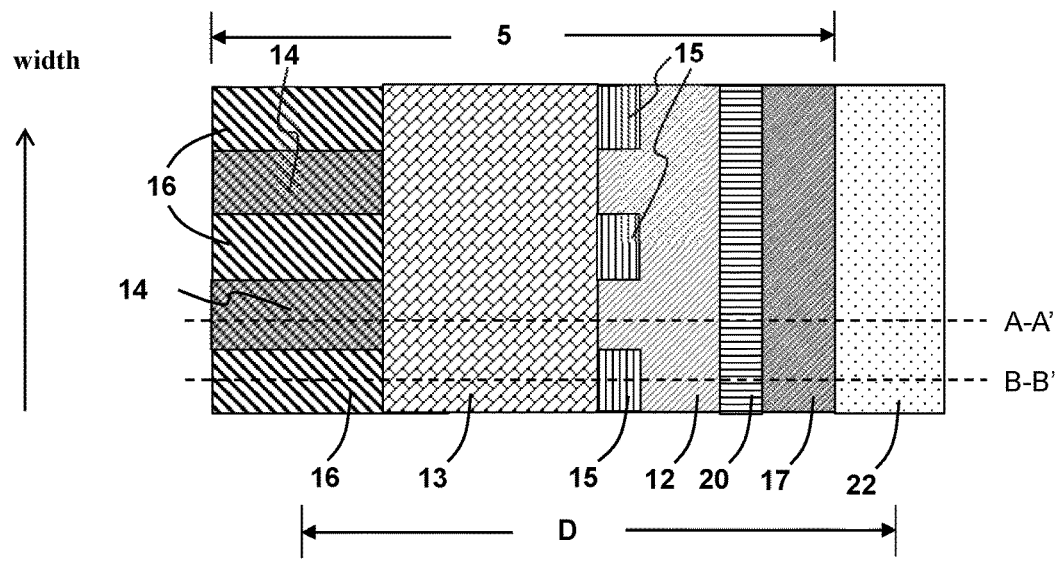
Fig. 5H
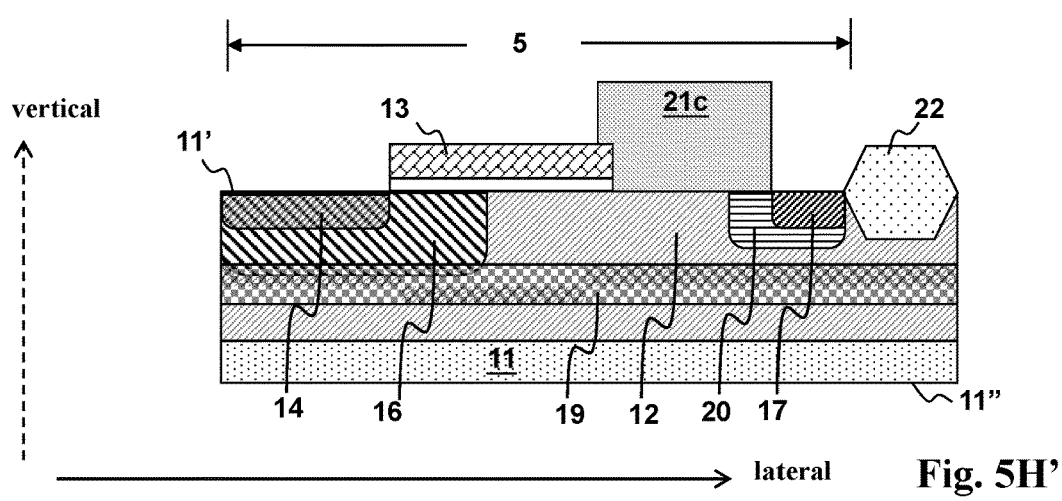
Fig. 5H'
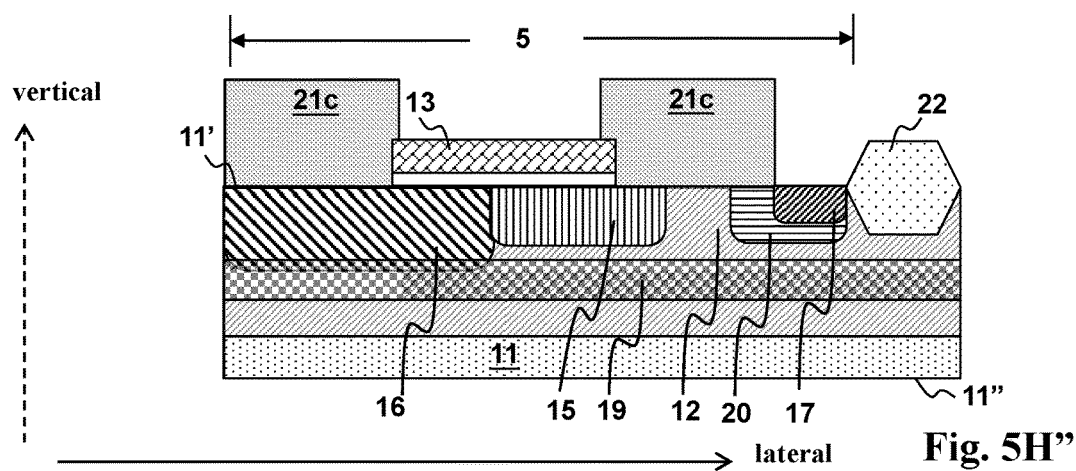
Fig. 5H"

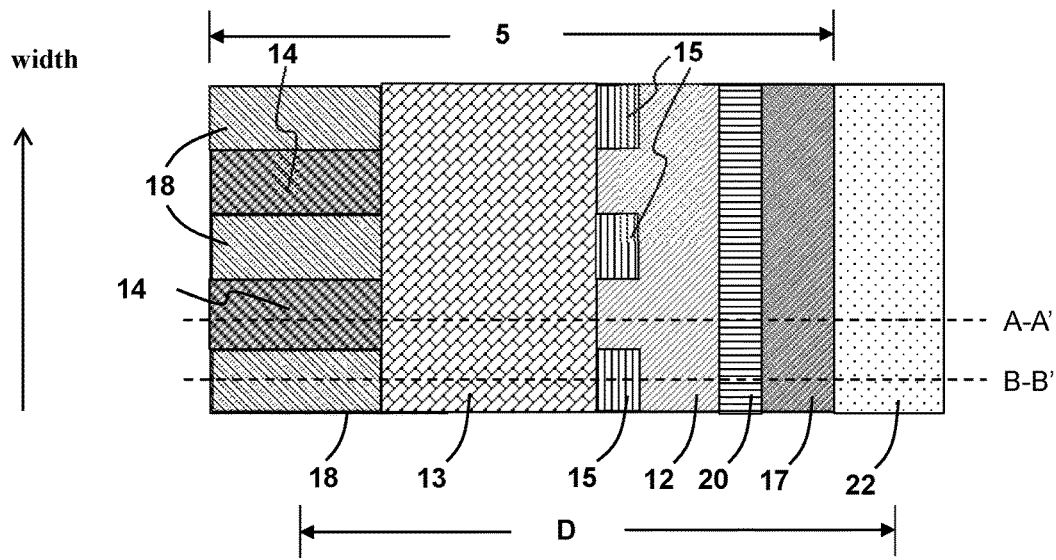
Fig. 5I
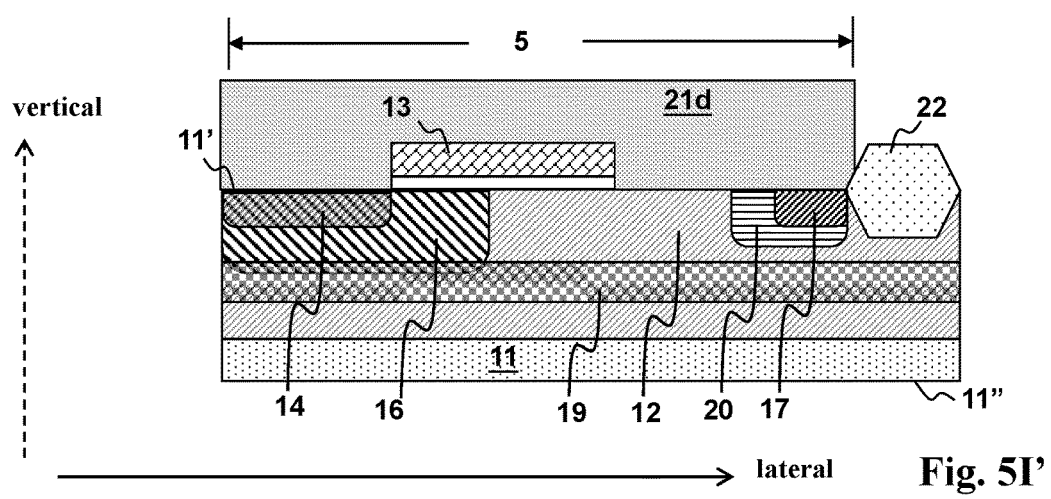
Fig. 5I'
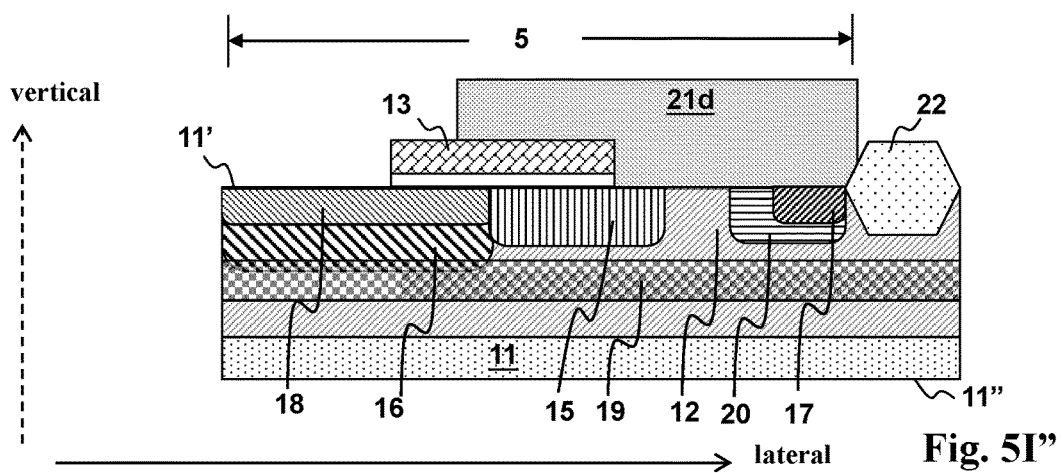
Fig. 5I"

HIGH VOLTAGE METAL OXIDE SEMICONDUCTOR DEVICE

CROSS REFERENCE

The present invention claims priority to Taiwan 106118055, filed on Jun. 1, 2017.

BACKGROUND OF THE INVENTION

Field of Invention

The present invention relates to a high voltage Metal Oxide Semiconductor (MOS) device; particularly it relates to a MOS device having a reduced unit pitch in the layout. The present invention also relates to a manufacturing method of the MOS device.

Description of Related Art

FIGS. 1A and 1B show a top view and a cross sectional view of a prior art high voltage MOS device (N type high voltage MOS device 1). As shown in FIGS. 1A and 1B, the high voltage MOS device 1 is formed in a semiconductor substrate 11, wherein along the vertical direction, the semiconductor substrate 11 has an upper surface 11' and a bottom surface 11" opposite to the top surface 11'. The high voltage MOS device 1 comprises an N type drift region 12, a P type body region 16, a gate 13, an N type source 14, an N type drain 17, and a P type body contact region 18. The N type source is formed in the P type body region 16, and the P type body contact region 18 is formed in the P type body region 16.

The prior art shown in in FIGS. 1A and 1B has a drawback that: when plural N type MOS devices 1 shown in FIGS. 1A and 1B form a switch array, each device having a unit pitch D (for example, the N type MOS device 1 of FIG. 1A is mirrored to the left side to form another high voltage MOS device which shares the N type source 14 and the P body contact region 18 with the shown N type MOS device 1 and is connected with the shown N type MOS device 1 in parallel), the unit pitch D of this prior art N type MOS device 1 is large, so the resistance per unit area of the N type high voltage device 1 is large, and therefore the manufacturing cost is high and the device performance is low.

Compared to the prior art of FIGS. 1A and 1B, the high voltage MOS device according to the present invention has a smaller unit pitch, so the resistance per unit area is smaller, or the operating voltage can be higher under the same unit area. Therefore, the present invention has a reduced cost, better performance, and broader application range.

SUMMARY OF THE INVENTION

From one perspective, the present invention provides a high voltage metal oxide semiconductor (MOS) device, which is formed in a semiconductor substrate having a top surface and a bottom surface opposite to the top surface in a vertical direction; the high voltage MOS device comprising: a first drift region with a first conductive type, which is formed in the semiconductor substrate, and is located under the top surface and contacts the top surface in the vertical direction; a body region with a second conductive type, which is formed in the first drift region, and is located under the top surface and contacts the top surface in the vertical direction; plural second drift regions with the second conductive type, which are formed in the first drift region, and are located under the top surface in the vertical direction; a gate, which is formed on the top surface, wherein in the vertical direction, a portion of the gate is stacked above a portion of the body region, and another portion of the gate is stacked above a portion of each of the second drift regions; at least one source region with the first conductive type, which is formed in the body region, and is located under the top surface and contacts the top surface in the vertical direction, and neighbors the gate in a lateral direction; a drain with the first conductive type, which is formed in the first drift region, and is located under the top surface and contacts the top surface in the vertical direction, and is separated from the source regions by the body region and the first drift region in the lateral direction, and is separated from the body region by the first drift region in the lateral direction; and at least one body contact region with the second conductive type, which is formed in the body region, and is located under the top surface and contacts the top surface in the vertical direction; wherein the plural second drift regions are separately located along a width direction such that any two neighboring second drift regions do not contact each other in the width direction, wherein each of the second drift regions contacts the body region in the lateral direction, and each of the second drift regions is separated from the drain by the first drift region, and each of the second drift regions is separated from the source by the body region.

In one embodiment, there are plural source regions and plural body contact regions, wherein the plural source regions are separately located along the width direction and any two neighboring source regions are separated from each other by one of the body contact regions in the width direction, and wherein the plural body contact regions are separately located along the width direction and any two neighboring body contact regions are separated from each other by one of the source regions in the width direction, and a portion of each of the body contact regions is located right below the gate.

In one embodiment, in the lateral direction, the plural second drift regions contact the body contact region.

In one embodiment, a number of the plural second drift regions corresponds to a number of the plural body contact regions, wherein each of the second drift regions contacts a corresponding one of the body contact regions in the lateral direction, and each of the second drift regions is not wider than the corresponding body contact region in the width direction.

In one embodiment, in the lateral direction, the body contact region contacts the source region, but does not contact the gate.

In one embodiment, the plural second drift regions contact the top surface in the vertical direction.

In one embodiment, the high voltage MOS device further includes a deep well region with the second conductive type, which is formed in the semiconductor substrate, and contacts the body region, and is located under a portion of the first drift region, wherein a portion of the deep well region is located right below the plural second drift region.

In one embodiment, the high voltage MOS device further includes a third drift region with the first conductive type, which is formed in the first drift region, and is located under the top surface and contacts the top surface in the vertical direction, and is separated from the source region by the body region and the first drift region in the lateral direction, wherein in the lateral direction, the drain is separated from the first drift region by the third drift region.

From another perspective, the present invention provides manufacturing method of a high voltage metal oxide semiconductor (MOS) device, comprising: providing a semiconductor substrate having a top surface and a bottom surface opposite to the top surface in a vertical direction; forming a first drift region with a first conductive type in the semiconductor substrate, wherein the first drift region is located under the top surface and contacts the top surface in the vertical direction; forming plural second drift regions with the second conductive type in the first drift region, wherein the plural second drift regions are located under the top surface in the vertical direction; forming a gate on the top surface; forming a body region with a second conductive type in the first drift region, wherein the body region is located under the top surface and contacts the top surface in the vertical direction; wherein in the vertical direction, a portion of the gate is stacked above a portion of the body region, and another portion of the gate is stacked above a portion of each of the second drift region; forming at least one source region with the first conductive type in the body region, wherein the at least one source region is located under the top surface and contacts the top surface in the vertical direction, and contacts the gate in a lateral direction; forming a drain with the first conductive type in the first drift region, wherein the drain is located under the top surface and contacts the top surface in the vertical direction, and is separated from the source regions by the body region and the first drift region in the lateral direction, and is separated from the body region by the first drift region in the lateral direction; and forming at least one body contact region with the second conductive type in the body region, wherein the at least one body contact region is located under the top surface and contacts the top surface in the vertical direction; wherein the plural second drift regions are separately located along a width direction such that any two neighboring second drift regions do not contact each other in the width direction, wherein each of the second drift regions contacts the body region in the lateral direction, and each of the second drift regions is separated from the drain by the first drift region, and each of the second drift regions is separated from the source by the body region.

In one embodiment, the manufacturing method further includes: forming a deep well region with the second conductive type in the semiconductor substrate, wherein the deep well region contacts the body region, and is located under a portion of the first drift region, wherein a portion of the deep well region is located right below the plural second drift region.

In one embodiment, the manufacturing method further includes: forming a third drift region with the first conductive type in the first drift region, wherein the third drift region is located under the top surface and contacts the top surface in the vertical direction, and is separated from the source region by the body region and the first drift region in the lateral direction, wherein in the lateral direction, the drain is separated from the first drift region by the third drift region.

The objectives, technical details, features, and effects of the present invention will be better understood with regard to the detailed description of the embodiments below.

BRIEF DESCRIPTION OF THE DRAWINGS

FIGS. 5A-5I" show schematic top views and corresponding cross sectional views to illustrate a manufacturing method of the high voltage MOS device according to the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
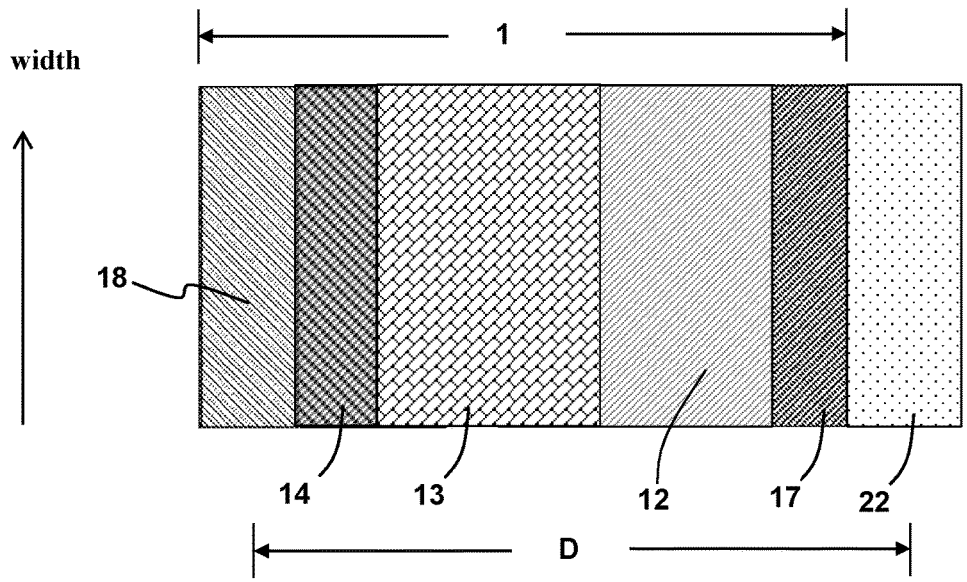
FIGS. 1A and 1B show schematic diagrams of a top view and a corresponding cross sectional view of an embodiment of a prior art high voltage MOS device respectively.
Figure 1B:
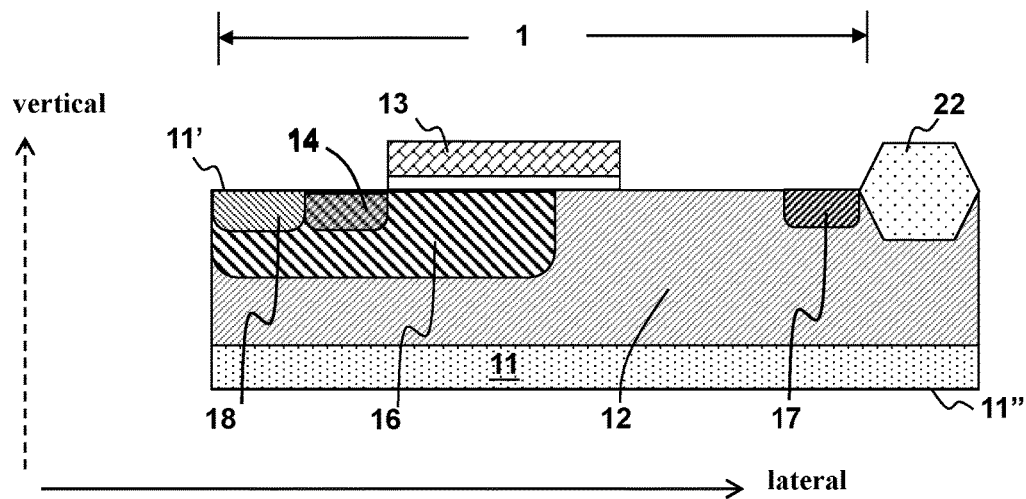
Figure 2A:
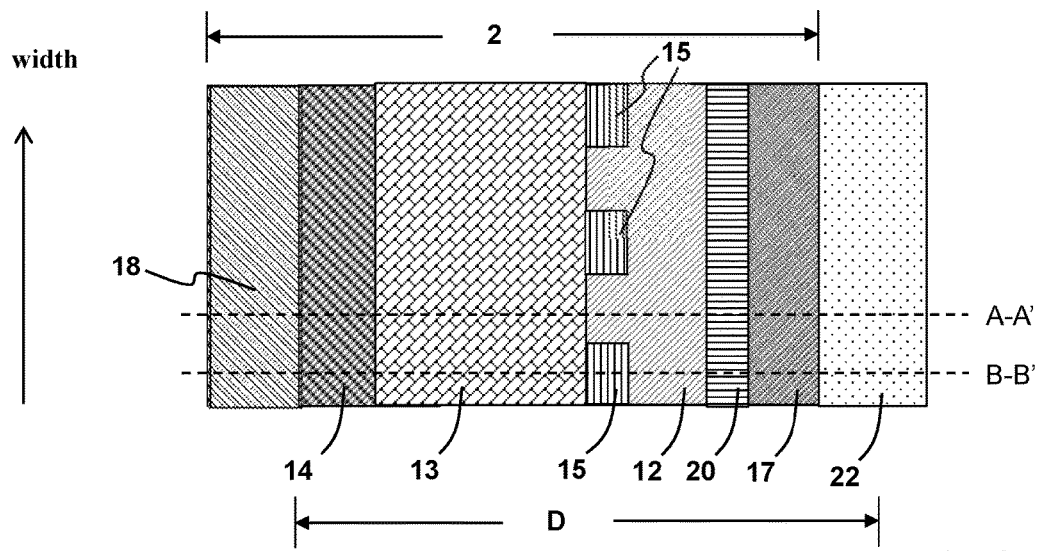
FIGS. 2A, 2B and 2C show schematic diagrams of a top view and two corresponding cross sectional views of an embodiment of the high voltage MOS device according to the present invention respectively.
Figure 2B:
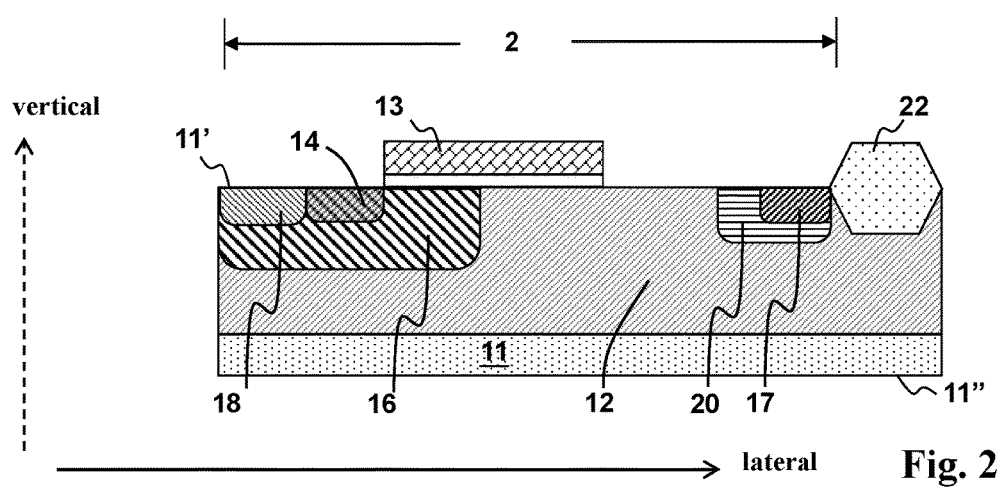
Figure 2C:
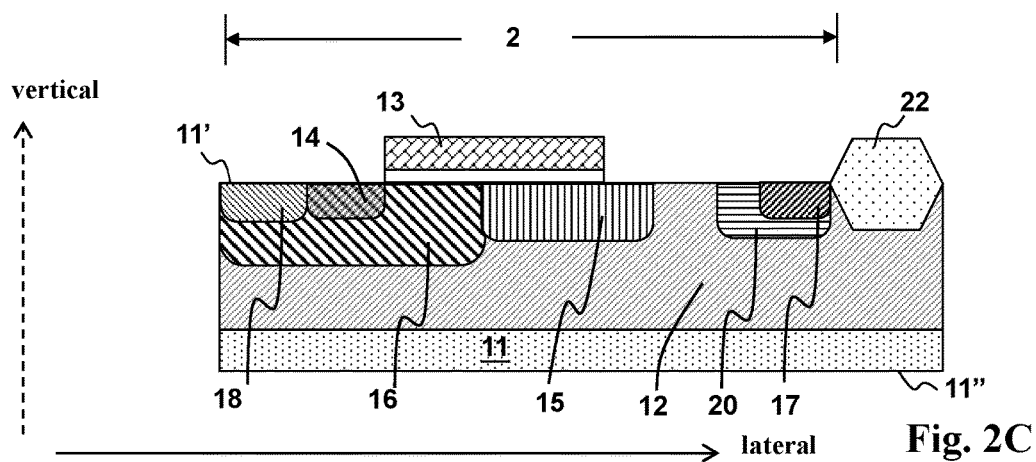

FIGS. 2A, 2B and 2C show schematic diagrams of an embodiment of the high voltage MOS device (high voltage MOS device 2) according to the present invention, by a top view (FIG. 2A), a first corresponding cross sectional view (i.e. FIG. 2B corresponding to line A-A' in FIG. 2A) and a second corresponding cross sectional view (i.e. FIG. 2C corresponding to line B-B' in FIG. 2A) respectively. As shown in the figures, the high voltage MOS device 2 is formed in a semiconductor substrate 11 which includes a top surface 11' and a bottom surface 11" opposite to the top surface 11' in a vertical direction (as indicated by the dashed arrow shown in FIG. 2B or 2C). The high voltage MOS device 2 comprises a first drift region 12 with a first conductive type, a body region 16 with a second conductive type, a gate 13, at least one source regions 14 with the first conductive type, plural second drift regions 15 with the second conductive type, a drain 17 with the first conductive type, and at least one body contact regions 18 with the second conductive type.

Still referring to FIGS. 2A, 2B and 2C, the first drift region 12 is formed in the semiconductor substrate 11, and is located under the top surface 11' and contacts the top surface 11' in the vertical direction. The body region 16 is formed in the first drift region 12, and is located under the top surface 11' and contacts the top surface 11' in the vertical direction. The plural second drift regions 15 are formed in the first drift region 12, and are located under the top surface 11' in the vertical direction. The gate 13 is formed on the top surface 11', wherein in the vertical direction, a portion of the gate 13 is stacked above a portion of the body region 16, and another portion of the gate 13 is stacked above a portion of each of the second drift regions 15. Note that the channel region of the high voltage MOS device 2 is the area where the gate 13 overlaps the body region 16 from top view. The is at least one and preferably plural source regions 14 formed in the body region 16, which are located under the top surface 11' and contact the top surface 11' in the vertical direction, and contact the gate 13 in a lateral direction (as indicated by the solid arrow noted "lateral" as shown in FIGS. 2B and 2C).

Still referring to FIGS. 2A, 2B and 2C, the drain 17 is formed in the first drift region 12, and is located under the top surface 11' and contacts the top surface 11' in the vertical direction, and is separated from the source regions 14 by the body region 16 and the first drift region 12 in the lateral direction, and is separated from the body region 16 by the first drift region 12 in the lateral direction. The is at least one and preferably plural body contact regions 18 which are formed in the body region 16, and are located under the top surface 11' and contact the top surface 11' in the vertical direction.

Still referring to FIGS. 2A, 2B and 2C, each of the second drift regions 15 contacts the body region 16 in the lateral direction. As shown in the figures, the plural second drift regions 15 are arranged separately along a width direction (as indicated by the arrow noted "width" as shown in FIG. 2A), substantially in parallel with each other, wherein any two neighboring second drift regions 15 do not contact each other in the width direction; each of the second drift regions 15 is separated from the drain 17 by the first drift region 12, and each of the second drift regions 15 is separated from the source 14 by the body region 16.

Still referring to FIGS. 2A, 2B and 2C, in one embodiment, the body contact region 18, the source region 14 and the gate 13 of the high voltage MOS device 2 are arranged substantially in parallel, and in the lateral direction, the body contact region 18 contacts the source region 14 but does not contact the gate 13. In one embodiment, as shown in FIG. 2A, the high voltage MOS device 2 of the present invention includes a single body contact region 18 and a signal source region 14 which are of rectangle shapes and are arranged to extend along the width direction and in parallel with the gate 13.

Figure 2D:
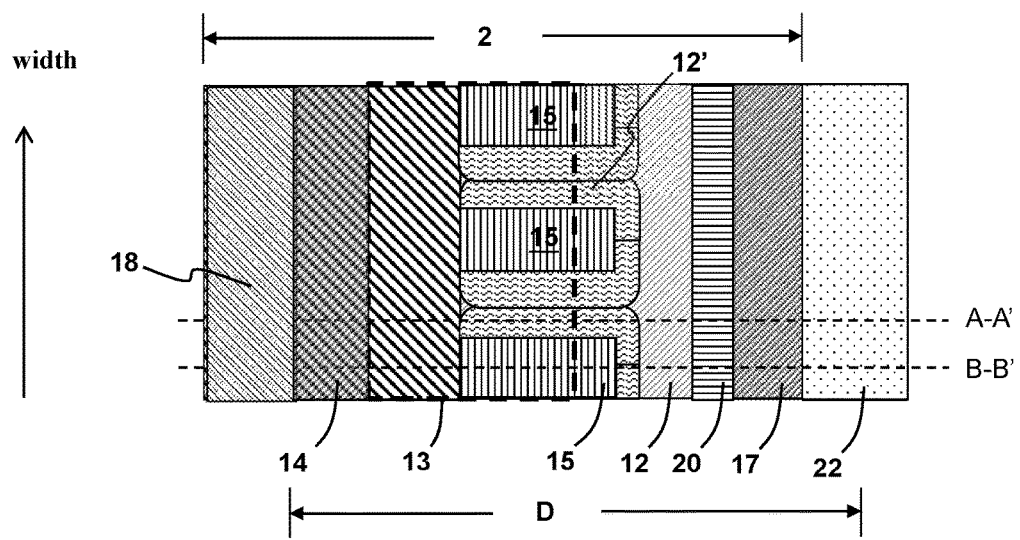
FIG. 2D shows a schematic diagram of a depletion region corresponding to FIG. 2A.

Note that the present invention is advantageous over the prior art in that the operating voltage can be higher. Taking high voltage MOS device 2 as an example, according to the present invention, when the second drift region 15 and the first drift region 12 is reversely biased, the plural second drift regions 15 which are arranged separately along the width direction and substantially in parallel with each other will pinch off with a relatively lower reverse bias voltage by the depletion effect of two neighboring second drift regions 15 and the first drift region 12 in between (e.g. the first drift region 12' as shown in FIG. 2D, wherein the gate 13 is drawn to be transparent to see the regions below), that is, the first drift region 12 between two neighboring second drift regions 15 is completely depleted in this situation; hence, the high voltage MOS device can have a higher operating voltage, or the unit pitch D of the high voltage MOS device can be reduced, to reduce cost, increase efficiency, and increase the application range of the device.

The "first conductive type" and the "second conductive type" indicate impurities of different conductive types doped into regions such as the aforementioned drift region, body region, body contact region, source, drain and gate; the first conductive type is for example N type and the second conductive type is for example P type, or the opposite.

The aforementioned "high voltage" MOS device indicates that the voltage applied on the drain is higher than a certain level such as 5V or higher. In this embodiment, the drain 17 is separated from the channel region by the first drift region 12, and the lateral distance from the drain 17 to the first drift region 12 can be adjusted depending on the operating voltage required for the high voltage MOS device to operate with.

Figure 3A:
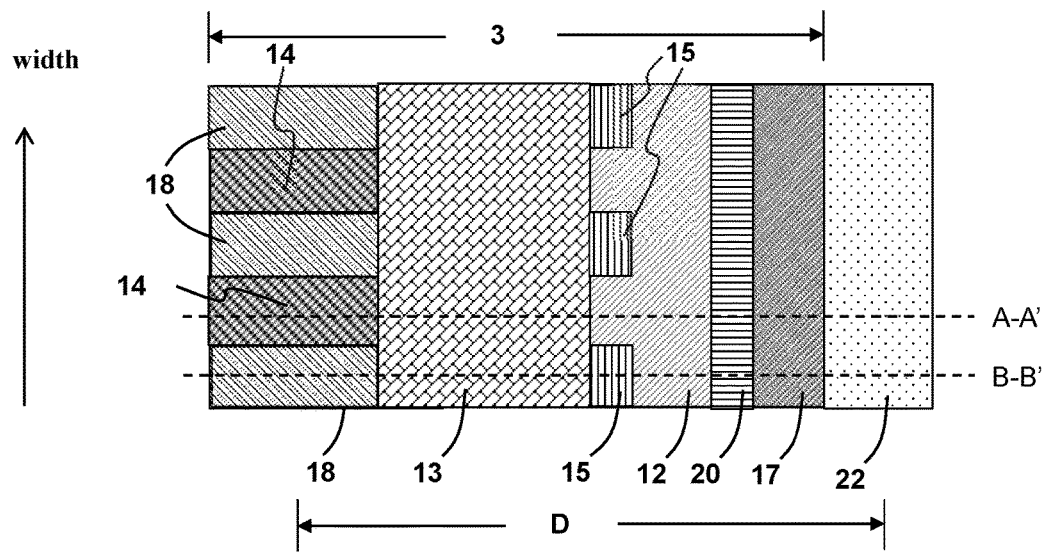
FIGS. 3A, 3B and 3C show schematic diagrams of a top view and two cross sectional views of an embodiment of the high voltage MOS device according to the present invention respectively.
Figure 3B:
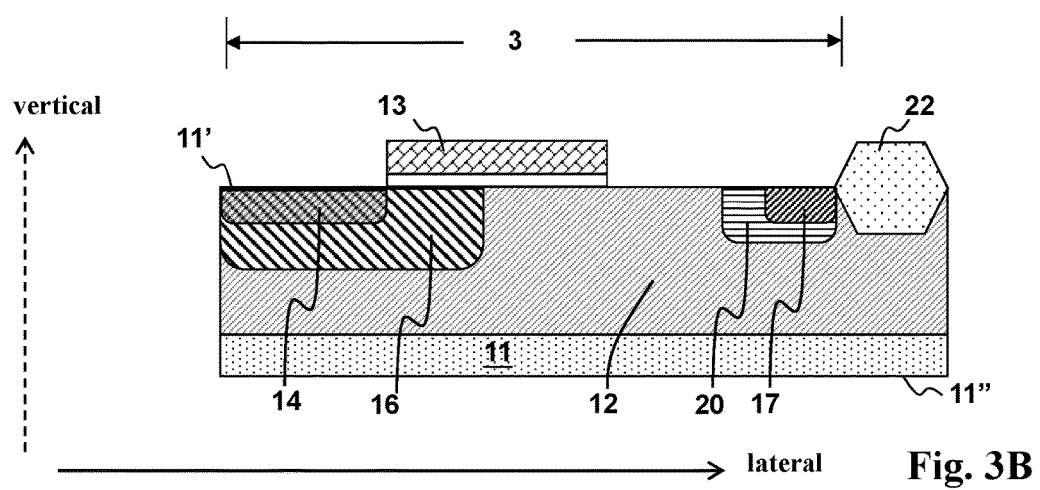
Figure 3C:
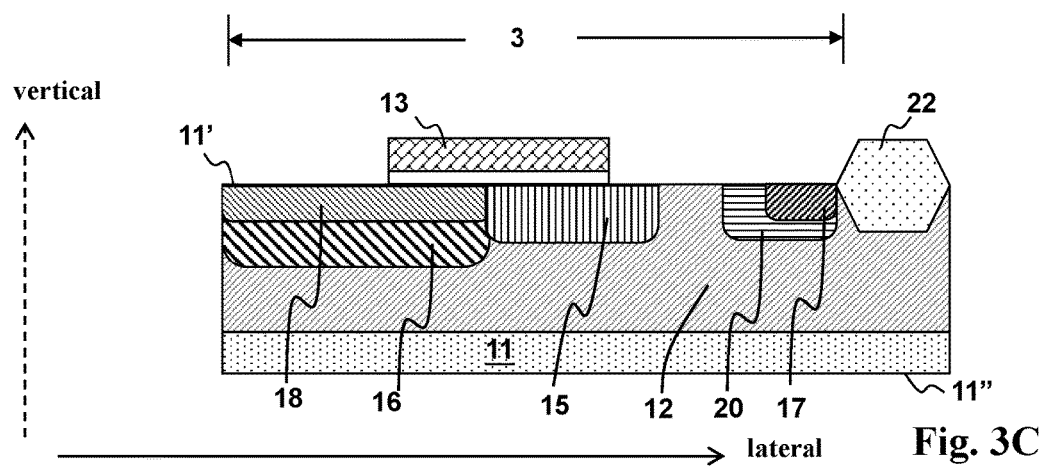

FIGS. 3A, 3B and 3C show schematic diagrams of an embodiment of the high voltage MOS device (high voltage MOS device 3) according to the present invention, by a top view (FIG. 3A), a first corresponding cross sectional view (i.e. FIG. 3B corresponding to line A-A' in FIG. 3A) and a second corresponding cross sectional view (i.e. FIG. 3C corresponding to line B-B' in FIG. 3A) respectively. As shown in the figures, in this embodiment, the high voltage MOS device 3 includes plural source regions 14 and plural body contact regions 18. As shown in the figures, the plural source regions 14 are arranged separately along the width direction and substantially in parallel with each other, and any two neighboring source regions 14 are separated from each other by the body contact region 18 in the width direction; and, the plural body contact regions 18 are arranged separately along the width direction and substantially in parallel with each other, and any two neighboring body contact regions 18 are separated from each other by the source region 14 in the width direction, wherein a portion of each of the body contact region 18 is located right below the gate 13. In one preferred embodiment, there are more body contact regions 18 than source regions 14 (i.e., the number of the body contact regions 18 is more than the number of the source regions 14).

The high voltage MOS device 3 according to the present invention is further advantageous over the prior art in that the minimum dimensions of the source regions 14 and the body contact regions 18 in the lateral direction can be smaller than the prior art when the source regions 14 and the body contact regions 18 are arranged as shown in FIGS. 3A, 3B and 3C; that is, the unit pitch D of the high voltage MOS device can be further reduced.

Figure 3D:
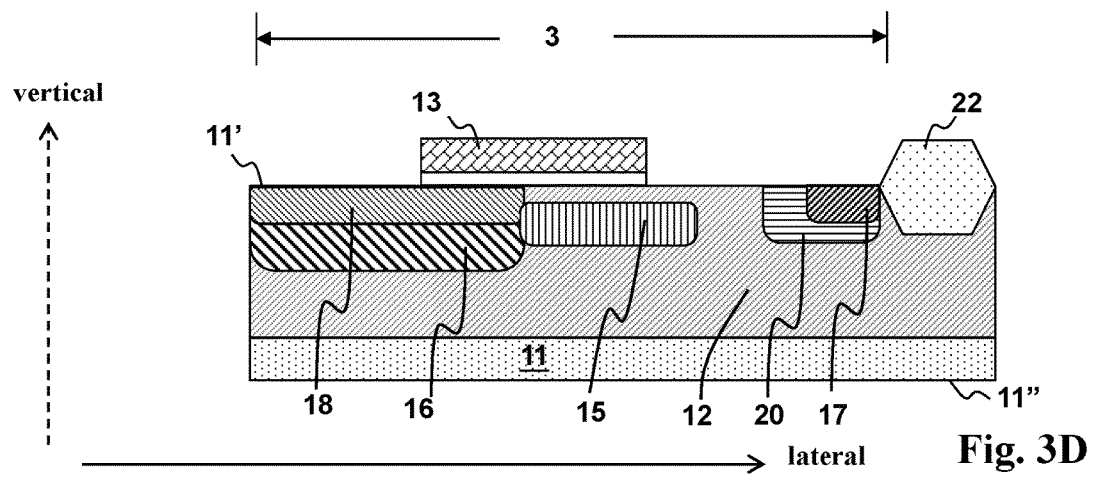
FIG. 3D shows a schematic diagram of another embodiment corresponding to FIG. 3A by a cross sectional view.

Still referring to FIGS. 3A, 3B and 3C, in one embodiment, each of the plural second drift regions 15 contacts the body contact region 18 in the lateral direction (as shown in FIG. 3C). In one embodiment, the number of the plural second drift regions 15 corresponds to the number of the plural body contact regions 18 (for example but not limited to both having the same number as in this embodiment), wherein in this embodiment, each of the second drift regions 15 contacts a corresponding one of the body contact regions 18 in the lateral direction, and in the width direction, each of the second drift regions 15 does not exceed the corresponding body contact region 18 in width. In one preferred embodiment, in the width direction, each of the second drift regions 15 has a width which is substantially equal to but is not wider than a width of the corresponding body contact region 18. In one embodiment, in the width direction, each of the second drift regions 15 is smaller than the corresponding body contact region 18 in width. Note that in the case wherein each of the second drift regions 15 is substantially equal to the corresponding body contact region 18 in width, the operating voltage can be increased without sacrificing the effective channel width of the high voltage MOS device. In one embodiment, as shown in FIG. 3C, the plural second drift regions 15 contact the top surface 11' in the vertical direction, while in another embodiment, as shown in FIG. 3D, the plural second drift regions 15 do not contact the top surface 11' in the vertical direction.

Figure 4A:
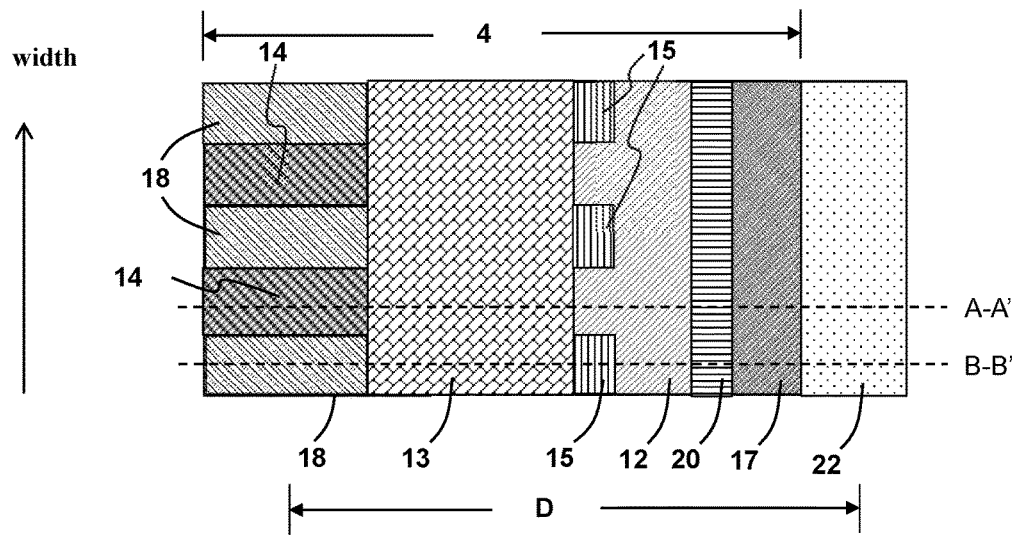
FIGS. 4A, 4B and 4C show schematic diagrams of a top view and two cross sectional views of an embodiment of the high voltage MOS device according to the present invention respectively.
Figure 4B:
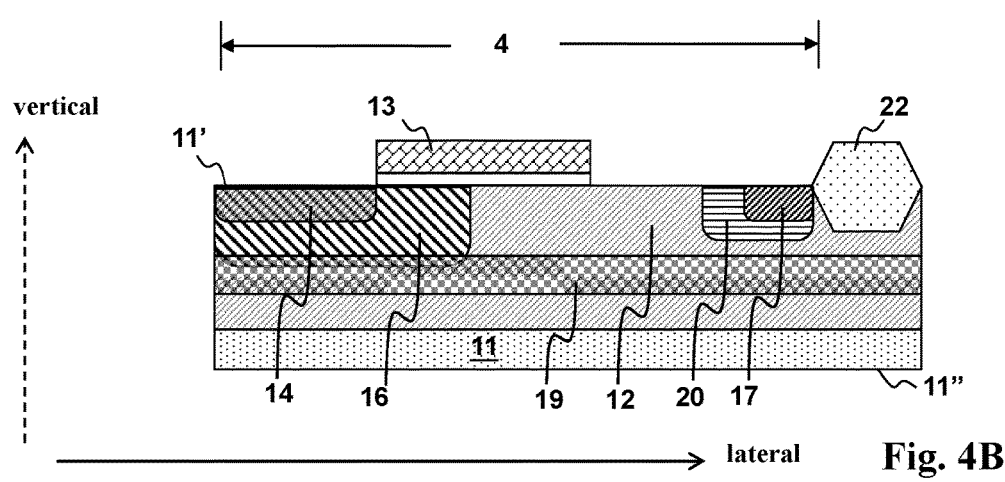
Figure 4C:
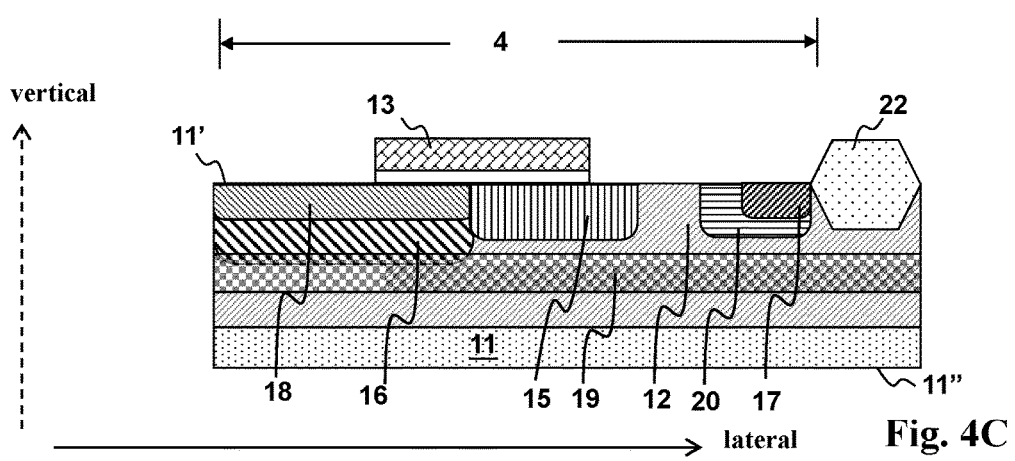

Referring to FIGS. 4A, 4B and 4C, in one embodiment, the high voltage MOS device (e.g. the high voltage MOS device 4) further includes a deep well region 19 with the second conductive type, wherein the deep well region 19 is formed in the semiconductor substrate 11, and contacts the body region 16. The deep well region 19 is located under a portion of the first drift region 12. A portion of the deep well region 19 is located right below the plural second drift region 15. In this embodiment, the deep well region 19 further provides depletion effect in other directions (for example the vertical direction), whereby the operating voltage can be increased even higher because the pinch-off will occur at a lower voltage. Or, from another perspective, the deep well region 19 may further reduce the unit pitch D of the high voltage MOS device. Thus, the present invention can reduce cost, increase efficiency, and increase the application range of the device.

Figure 3E:
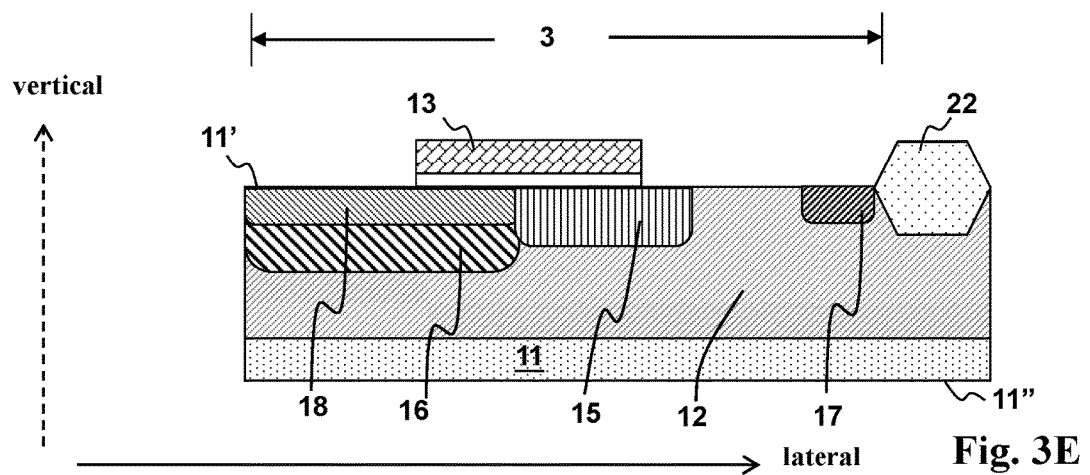
FIG. 3E shows a schematic diagram of a cross sectional view of another embodiment of the high voltage MOS device according to the present invention.

In one embodiment, the high voltage MOS device (e.g. the high voltage MOS device 2, 3, or 4) further includes an optional third drift region 20 with the first conductive type. The third drift region 20 is formed in the first drift region 12. The third drift region 20 is located under the top surface 11' and contacts the top surface 11' in the vertical direction, and is separated from the source region 14 by the body region 16 and the first drift region 12 in the lateral direction. In the lateral direction, the drain 17 is separated from the first drift region 12 by the third drift region 20. The third drift region 20 can further lower the gradient from the channel to the drain region of the high voltage MOS device, whereby the operating voltage can be further increased. The third drift region 20 is not necessarily required and may be omitted (for example in the embodiment shown in FIG. 3E).

Figure 5A:
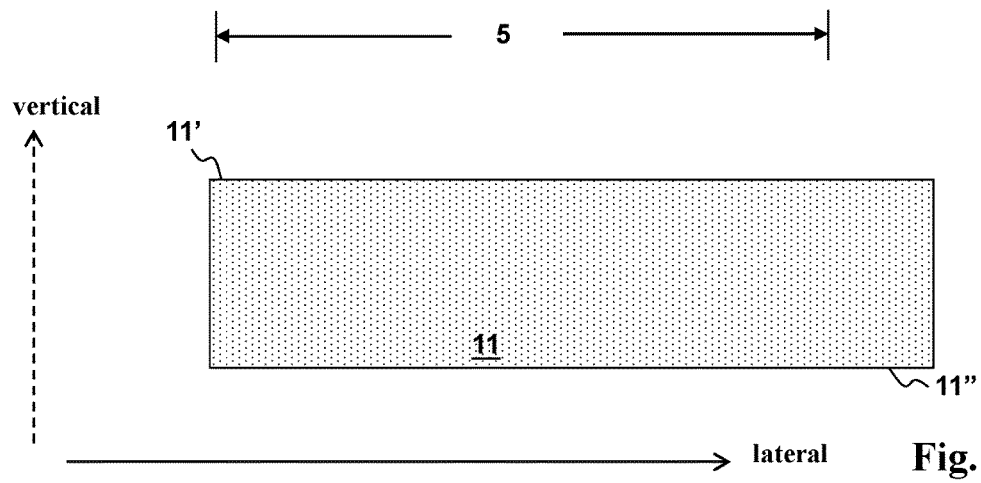
Figure 5B:
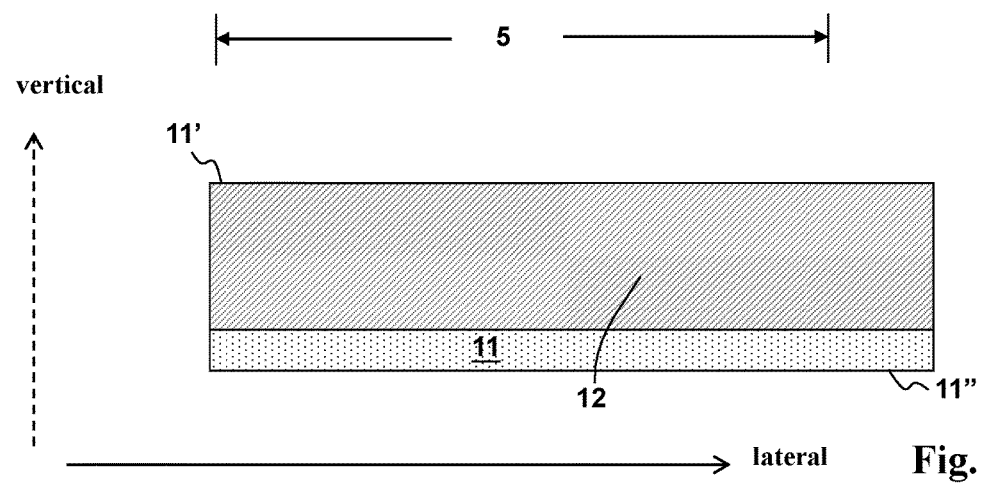

FIGS. 5A-5I" show schematic diagrams, in top view and corresponding cross sectional views, of a manufacturing method of the high voltage MOS device (high voltage MOS device 5) according to the present invention. First, as shown in FIG. 5A, a semiconductor substrate 11 is provided, wherein the semiconductor substrate 11 is for example but not limited to a P type silicon substrate, but certainly it may be other types of semiconductor substrate. The semiconductor substrate 11 includes a top surface 11' and a bottom surface 11" opposite to the top surface 11' in a vertical direction (as indicated by the dashed arrow as shown in the figure). Next, as shown in FIG. 5B, a first drift region 12 with a first conductive type is formed in the semiconductor substrate 11. The first drift region 12 is located under the top surface 11' and contacts the top surface 11' in the vertical direction. The first drift region 12 may be formed by for example but not limited to lithography, ion implantation, and thermal process steps.

Figure 5C:
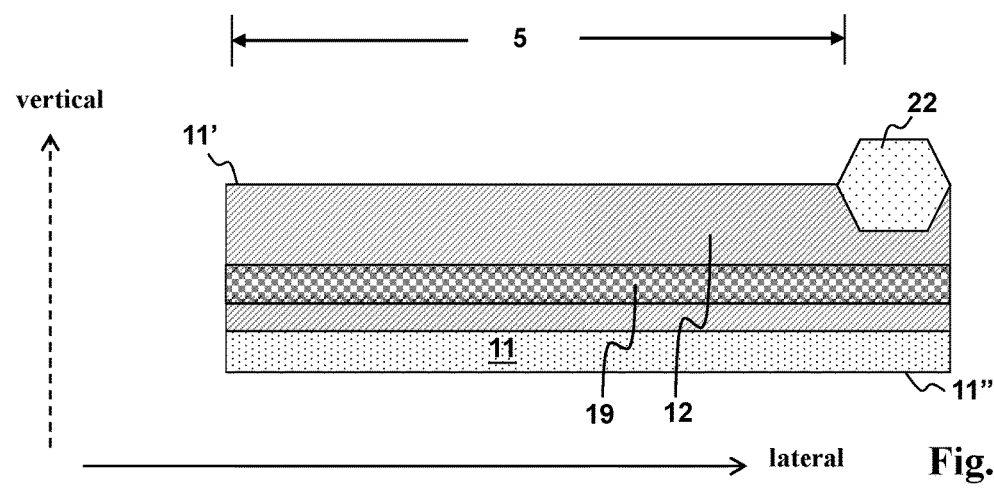

Next, as shown in FIG. 5C, a deep well region 19 with the second conductive type is formed in the semiconductor substrate 11. The deep well region 19 is located under a portion of the first drift region 12. Next, a field oxide region 22 is formed to define an active region of the high voltage MOS device 5. In another embodiment, the step of forming the deep well region 19 may be omitted, that is, the manufactured high voltage MOS device will not include the deep well region 19, such as in the high voltage MOS device 2 or 3.

FIGS. 5D, 5D' and 5D" are a top view (FIG. 5D), a first corresponding cross sectional view (FIG. 5D', corresponding to the cross section line A-A' in FIG. 5D) and a second corresponding cross sectional view (FIG. 5D", corresponding to the cross section line B-B' in FIG. 5D) respectively. As shown in the figures, next, a photoresist layer 21 is formed to define an ion implantation region of the second drift region 15 with the second conductive type. An ion implantation process is performed to implant impurities with the second conductive type into the defined region to form the plural second drift regions 15 in the first drift region 12, wherein the plural second drift regions 15 are located under the top surface 11' and contact the top surface 11' in the vertical direction. The plural second drift regions 15 are arranged separately along a width direction (as indicated by the arrow noted "width" shown in FIG. 5D) and substantially in parallel with each other, wherein any two neighboring second drift regions 15 do not contact each other in the width direction. In one embodiment, in the vertical direction, the plural second drift regions 15 are located under the top surface 11' but do not contact the top surface 11'. Next, a gate 13 (including a gate electrode layer and a gate dielectric layer) is formed and stacked on the top surface 11' as shown in FIGS. 5E, 5E' and 5E".

FIGS. 5F, 5F' and 5F" are a top view (FIG. 5F), a first corresponding cross sectional view (FIG. 5F', corresponding to the cross section line A-A' in FIG. 5F) and a second corresponding cross sectional view (FIG. 5F", corresponding to the cross section line B-B' in FIG. 5F) respectively. As shown in the figures, next, a photoresist layer 21a is formed to define an ion implantation region of the body region 16 with the second conductive type. An ion implantation process is performed to implant impurities with the second conductive type into the defined region to form the body region 16 in the first drift region 12, wherein the body region 16 is located under the top surface 11' and contact the top surface 11' in the vertical direction. A portion of the gate 13 is stacked above a portion of the body region 16, and another portion of the gate 13 is stacked above a portion of each of the second drift regions 15. In one embodiment, the ion implantation process may be performed with a tilted angle. A thermal process is performed to diffuse the implanted impurities to form the body region 16. As shown in the figures, the deep well region 19 contacts the body region 16, and a portion of the deep well region 19 is right below the plural second drift regions 15.

FIGS. 5G, 5G' and 5G" are a top view (FIG. 5G), a first corresponding cross sectional view (FIG. 5G', corresponding to the cross section line A-A' in FIG. 5G) and a second corresponding cross sectional view (FIG. 5G", corresponding to the cross section line B-B' in FIG. 5G) respectively. As shown in the figures, next, an ion implantation region of the third drift region 20 with the first conductive type is defined by a photoresist layer 21b and the field oxide region 22. An ion implantation process is performed to implant impurities with the first conductive type into the defined region to form the third drift region 20 in the first drift region 12. In one embodiment, the step of forming the third drift region 20 may be omitted, i.e., the manufactured high voltage MOS device hence does not include the third drift region 20.

FIGS. 5H, 5H' and 5H" are a top view (FIG. 5H), a first corresponding cross sectional view (FIG. 5H', corresponding to the cross section line A-A' in FIG. 5H) and a second corresponding cross sectional view (FIG. 5H", corresponding to the cross section line B-B' in FIG. 5H) respectively. As shown in the figures, next, ion implantation regions of plural source regions 14 with the first conductive type and a drain region 17 with the first conductive type are defined by the photoresist layer 21c, the field oxide region 22, and the gate 13. An ion implantation process is performed to implant impurities with the first conductive type into the defined region to form the plural source regions 14 in the body region 16 and to form the drain region 17 in the first drift region 12. In the lateral direction, each of the second drift regions 15 contacts the body region 16 and each of the second drift regions 15 is separated from the drain 17 by the first drift region 12, and each of the second drift regions 15 is separated from the source 14 by the body region 16. The drain 17 is located under the top surface 11' and contacts the top surface 11' in the vertical direction, and in the lateral direction, the drain 17 is separated from the source regions 14 by the body region 16, the first drift region 12 and the third drift region 20, and is separated from the body region 16 by the first drift region 12 and the third drift region 20 in the lateral direction. In another embodiment, the step of forming the third drift region 20 may be omitted, i.e., the manufactured high voltage MOS device hence does not include the third drift region 20.

FIGS. 5I, 5I' and 5I" are a top view (FIG. 5I), a first corresponding cross sectional view (FIG. 5I', corresponding to the cross section line A-A' in FIG. 5I) and a second corresponding cross sectional view (FIG. 5I", corresponding to the cross section line B-B' in FIG. 5I) respectively. As shown in the figures, next, an ion implantation region of the body contact region 18 with the second conductive type is defined by the photoresist layer 21, the field oxide region 22, and the gate 13. An ion implantation process is performed to implant impurities with the second conductive type into the defined region to form the body contact region 18 in the body region 16, wherein the body contact region 18 is located under the top surface 11' and contacts the top surface 11' in the vertical direction. In one embodiment, the ion implantation process may be performed with a tilted angle. A thermal process follows to form the body contact region 18. In this embodiment, the plural source regions 14 are arranged separately along the width direction and substantially in parallel with each other, and any two neighboring source regions 14 are separated from each other by the body contact region 18 in the width direction. And, the plural body contact regions 18 are arranged separately along the width direction and substantially in parallel with each other, and any two neighboring body contact regions 18 are separated from each other by the source region 14 in the width direction, wherein a portion of each of the body contact region 18 is located right below a portion of the gate 13 in the vertical direction. In one embodiment, the plural second drift region 15 contact the body contact regions 18 in the lateral direction.

The present invention has been described in considerable detail with reference to certain preferred embodiments thereof. It should be understood that the description is for illustrative purpose, not for limiting the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. As an example, in the high voltage MOS device 4 which includes the deep well region 19, the third drift region 20 can be omitted. Furthermore, those skilled in this art can readily conceive variations and modifications within the spirit of the present invention. For example, other process steps or structures which do not affect the primary characteristic of the device, such as a threshold voltage adjustment region, or a buried layer, and etc., can be added; for another example, the lithography step described in the above can be replaced by electron beam lithography or other lithography techniques. In view of the foregoing, the spirit of the present invention should cover all such and other modifications and variations, which should be interpreted to fall within the scope of the following claims and their equivalents.

What is claimed is:

1. A high voltage metal oxide semiconductor (MOS) device, which is formed in a semiconductor substrate having a top surface and a bottom surface opposite to the top surface in a vertical direction; the high voltage MOS device comprising:
   a first drift region with a first conductive type, which is formed in the semiconductor substrate, and is located under the top surface and contacts the top surface in the vertical direction;
   a body region with a second conductive type, which is formed in the first drift region, and is located under the top surface and contacts the top surface in the vertical direction;
   plural second drift regions with the second conductive type, which are formed in the first drift region, and are located under the top surface in the vertical direction;
   a gate, which is formed on the top surface, wherein in the vertical direction, a portion of the gate is stacked above a portion of the body region, and another portion of the gate is stacked above a portion of each of the second drift regions;
   plural source regions with the first conductive type, which are formed in the body region, and are located under the top surface and contact the top surface in the vertical direction, and neighbor the gate in a lateral direction;
   a drain with the first conductive type, which is formed in the first drift region, and is located under the top surface and contacts the top surface in the vertical direction, and is separated from the plural source regions by the body region and the first drift region in the lateral direction, and is separated from the body region by the first drift region in the lateral direction; and
   plural body contact regions with the second conductive type, which are formed in the body region, and are located under the top surface and contact the top surface in the vertical direction;
   wherein the plural second drift regions are separately located along a width direction such that any two neighboring second drift regions do not contact each other in the width direction, and each of the second drift regions is separated from the drain by the first drift region, and each of the second drift regions is separated from the plural source regions by the body region;
   wherein the plural source regions are separately located along the width direction and any two neighboring source regions are separated from each other by one of the body contact regions in the width direction, and wherein the plural body contact regions are separately located along the width direction and any two neighboring body contact regions are separated from each other by one of the source regions in the width direction, and a portion of each of the body contact regions is located right below the gate;
   wherein in the lateral direction, the plural second drift regions contact the plural body contact regions.

2. The high voltage MOS device of claim 1, wherein each of the second drift regions contacts the body region in the lateral direction.

3. The high voltage MOS device of claim 1, wherein a number of the plural second drift regions corresponds to a number of the plural body contact regions, wherein each of the second drift regions contacts a corresponding one of the body contact regions in the lateral direction.

4. The high voltage MOS device of claim 3, wherein each of the second drift regions is not wider than the corresponding body contact region in the width direction.

5. The high voltage MOS device of claim 1, further comprising a third drift region with the first conductive type, which is formed in the first drift region, and is located under the top surface and contacts the top surface in the vertical direction, and is separated from the source region by the body region and the first drift region in the lateral direction, wherein in the lateral direction, the drain is separated from the first drift region by the third drift region.

6. The high voltage MOS device of claim 1, wherein the plural second drift regions contact the top surface in the vertical direction.

7. The high voltage MOS device of claim 1, further including a deep well region with the second conductive type, which is formed in the semiconductor substrate, and contacts the body region, and is located under a portion of the first drift region, wherein a portion of the deep well region is located right below the plural second drift regions.

8. A high voltage metal oxide semiconductor (MOS) device, which is formed in a semiconductor substrate having a top surface and a bottom surface opposite to the top surface in a vertical direction; the high voltage MOS device comprising:
- a first drift region with a first conductive type, which is formed in the semiconductor substrate, and is located under the top surface and contacts the top surface in the vertical direction;
- a body region with a second conductive type, which is formed in the first drift region, and is located under the top surface and contacts the top surface in the vertical direction;
- plural second drift regions with the second conductive type, which are formed in the first drift region, and are located under the top surface in the vertical direction;
- a gate, which is formed on the top surface, wherein in the vertical direction, a portion of the gate is stacked above a portion of the body region, and another portion of the gate is stacked above a portion of each of the second drift regions;
- at least one source region with the first conductive type, which is formed in the body region, and is located under the top surface and contacts the top surface in the vertical direction, and neighbors the gate in a lateral direction;
- a drain with the first conductive type, which is formed in the first drift region, and is located under the top surface and contacts the top surface in the vertical direction, and is separated from the at least one source region by the body region and the first drift region in the lateral direction, and is separated from the body region by the first drift region in the lateral direction;
- at least one body contact region with the second conductive type, which is formed in the body region, and is located under the top surface and contacts the top surface in the vertical direction; and
- a third drift region with the first conductive type, which is formed in the first drift region, and is located under the top surface and contacts the top surface in the vertical direction, and is separated from the at least one source region by the body region and the first drift region in the lateral direction, wherein in the lateral direction, the drain is separated from the first drift region by the third drift region;
- wherein the plural second drift regions are separately located along a width direction such that any two neighboring second drift regions do not contact each other in the width direction, wherein each of the second drift regions contacts the body region in the lateral direction, and each of the second drift regions is separated from the drain by the first drift region, and each of the second drift regions is separated from the at least one source region by the body region.

* * * * *